United States Patent
Cha et al.

(10) Patent No.: US 10,411,221 B2
(45) Date of Patent: Sep. 10, 2019

(54) ORGANIC ELECTRONIC DEVICE AND FABRICATION METHOD THEREOF

(71) Applicant: HUNET PLUS, Nonsan (KR)

(72) Inventors: Hyuk Jin Cha, Asan (KR); Mi Sun Yoo, Daejeon (KR)

(73) Assignee: HUNET PLUS, Cheonnan (KR)

( * ) Notice: Subject to any disclaimer, the term of this patent is extended or adjusted under 35 U.S.C. 154(b) by 318 days.

(21) Appl. No.: 15/110,311

(22) PCT Filed: Jun. 3, 2014

(86) PCT No.: PCT/KR2014/004973
§ 371 (c)(1),
(2) Date: Jul. 7, 2016

(87) PCT Pub. No.: WO2015/108251
PCT Pub. Date: Jul. 23, 2015

(65) Prior Publication Data
US 2016/0329524 A1      Nov. 10, 2016

(30) Foreign Application Priority Data
Jan. 16, 2014   (KR) .................. 10-2014-0005500

(51) Int. Cl.
*H01L 31/0203*   (2014.01)
*H01L 51/52*      (2006.01)
(Continued)

(52) U.S. Cl.
CPC ........ *H01L 51/5259* (2013.01); *H01L 51/107* (2013.01); *H01L 51/448* (2013.01);
(Continued)

(58) Field of Classification Search
CPC .................................................. H01L 51/5259
(Continued)

(56) References Cited

U.S. PATENT DOCUMENTS 5,989,983 A * 11/1999 Goo .................. H01L 21/02134
                                                                 257/E21.241
6,548,912 B1    4/2003 Graff et al.
(Continued)

FOREIGN PATENT DOCUMENTS

CN       2011861232      12/2013
EP        1804310 A2      7/2007
(Continued)

OTHER PUBLICATIONS

International Search Report.
Office Action from China Patent Office, dated Jan. 29, 2018.

*Primary Examiner* — Ajay Arora
(74) *Attorney, Agent, or Firm* — STIP Law Group, LLC

(57) ABSTRACT

Provided is an organic electronic device comprising: a substrate on which an organic photoelectric device unit is arranged; a first encapsulation film that encloses the organic photoelectric device unit and contains an inorganic or organic material; a second encapsulation film that encloses the first encapsulation film and contains a cured product of a photo-curable material having an ethylenically unsaturated bond; and a third encapsulation film that encloses the second encapsulation film and contains a photo-cured product of a photo-curable spin on glass (SOG) material.

11 Claims, 1 Drawing Sheet

(51) Int. Cl.
*H01L 51/10* (2006.01)
*H01L 51/44* (2006.01)
*H01L 51/56* (2006.01)

(52) U.S. Cl.
CPC ...... *H01L 51/5237* (2013.01); *H01L 51/5256* (2013.01); *H01L 51/56* (2013.01); *Y02E 10/549* (2013.01)

(58) Field of Classification Search
USPC .......................................................... 257/433
See application file for complete search history.

(56) References Cited

U.S. PATENT DOCUMENTS

| | | | |
|---|---|---|---|
| 6,573,652 B1* | 6/2003 | Graff | H01L 23/562 257/E23.194 |
| 2004/0009428 A1* | 1/2004 | Tamura | G03F 7/0047 430/280.1 |
| 2011/0177637 A1 | 7/2011 | McCormick et al. | |
| 2014/0049825 A1* | 2/2014 | van Mol | H01L 51/5253 359/513 |
| 2015/0129018 A1* | 5/2015 | Declerck | B32B 17/10018 136/251 |
| 2015/0293283 A1* | 10/2015 | Nara | G02B 1/04 348/340 |

FOREIGN PATENT DOCUMENTS

| | | |
|---|---|---|
| EP | 1835344 A1 | 9/2007 |
| EP | 2445029 A1 | 4/2012 |
| JP | 2001264225 A | 9/2001 |
| JP | 2003323132 A | 11/2003 |
| JP | 2005324406 A | 11/2005 |
| JP | 2006326899 A | 12/2006 |
| JP | 2007184279 A | 7/2007 |
| JP | 2008266408 A | 11/2008 |
| JP | 2010027500 A | 2/2010 |
| JP | 2012190612 A | 10/2012 |
| JP | 2013237734 A | 11/2013 |
| KR | 1020020016922 | 12/2002 |
| KR | 1020010043756 | 1/2003 |
| KR | 1020020021265 | 10/2003 |
| KR | 1020100061825 | 1/2012 |
| KR | 1020110113121 | 5/2012 |
| KR | 1020127010504 | 8/2012 |
| KR | 101253529 | 4/2013 |
| KR | 1020137013292 | 11/2013 |
| KR | 1020130063001 | 12/2013 |
| WO | 2005036270 A1 | 12/2006 |
| WO | 2007025140 A1 | 1/2007 |
| WO | 2013187577 A1 | 12/2013 |

* cited by examiner

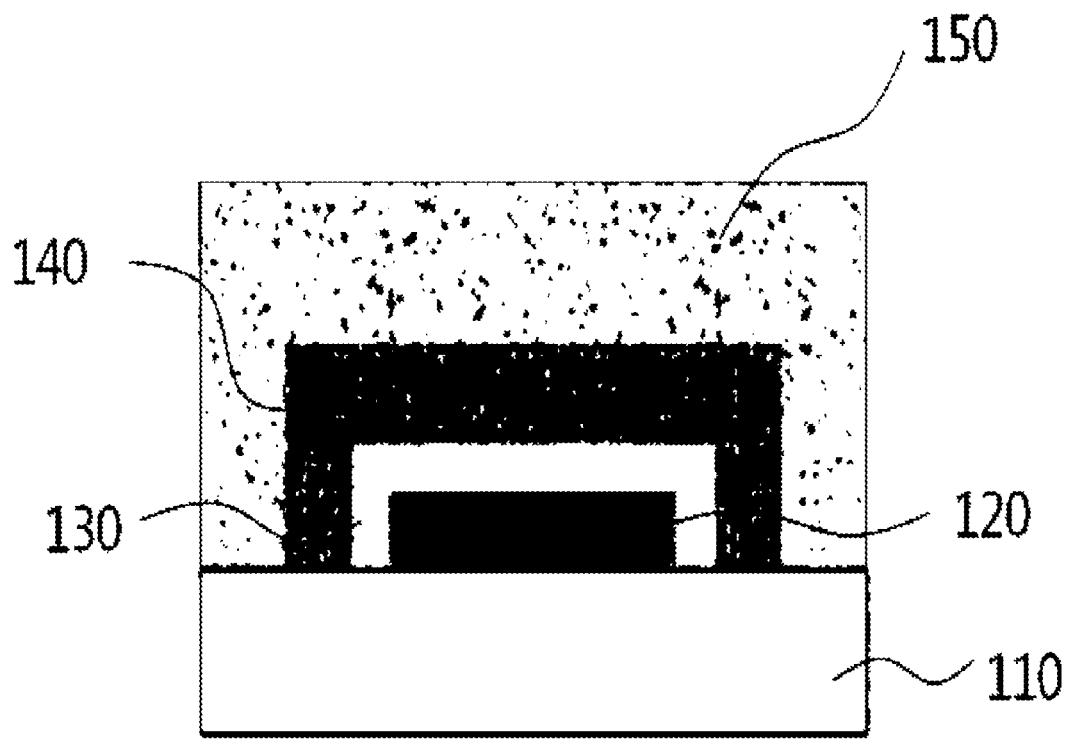

ORGANIC ELECTRONIC DEVICE AND FABRICATION METHOD THEREOF

CROSS-REFERENCE TO RELATED APPLICATIONS

This application is the U.S. National Phase under 35 U.S.C. § 371 of International Application No. PCT/KR2014/004973 filed on Jun. 3, 2014, which in turn claims the benefit of Korean Application No. 10-2014-0005500, filed on Jan. 16, 2014, the disclosures of which are incorporated by reference into the present application.

Technical Field

The present invention relates to an organic electronic device, and more specifically to an organic electronic device that is effectively protected from external water and oxygen, ensuring its long-term operation, and a method for fabricating the organic electronic device.

BACKGROUND ART

Organic electronic devices generally refer to devices in which when charges are injected into an organic layer disposed between an anode and a cathode, phenomena occur, such as light emission or electricity flow. The functions of the devices are determined depending on what kind of organic material is selected.

Organic light emitting devices (OLEDs) are representative organic electronic devices and have received attention as next-generation flat panel displays due to their thin thickness, light weight, and good color representation. Organic light emitting devices can be fabricated on existing inorganic substrates, including glass substrates and silicon substrates, metal substrates, and flexible substrates, such as plastic substrates and metal foils. Due to their high sensitivity to water and oxygen, organic electronic devices tend to lose their luminous efficiency and lifetime when exposed to ambient air or when water enters the panels from the outside.

As solutions to the above problems, attempts have been made to block water and oxygen from entering from the outside by the use of glass caps or metal caps, the use of laminated encapsulation films or the deposition of inorganic materials. Another method has been proposed to achieve good adhesiveness and hermetic sealing by applying a curable film or material to the surface of an organic layer or metal layer and curing the curable film or material.

However, susceptibility of glass caps to mechanical damage makes it difficult to fabricate organic electronic devices over a large area, differences in the coefficient of thermal expansion between metal caps and substrates are problematic in terms of processing, and water and oxygen enter laminated adhesive films through the interface between the adhered film layers. A process is known in which organic materials are deposited under vacuum and inorganic materials are sputtered under vacuum. According to this process, inorganic materials should be deposited to form a multilayer structure by vacuum sputtering in order to prevent the ingress of water and oxygen through the upper interface of the sputtered structure, leading to low productivity, and the formation of the multilayer structure of organic materials and inorganic materials under vacuum is an obstacle to large-scale production.

Liquid encapsulation methods have the disadvantage that by-products formed by cleavage of chemical bonds and in the course of curing or unreacted curing initiators remain in sealed structures, impeding the driving of organic electronic devices or shortening the lifetime of organic electronic devices. For example, Korean Patent Publication No. 2002-0090851 discloses an organic light emitting device that has a barrier film consisting of one or more layers on a light emitting element to block water from entering wherein the barrier film is formed by laminating a dry film photoresist or applying and curing a transparent photosensitizer.

The barrier film formed of the dry film photoresist or the liquid photosensitizer can function to block external environmental factors, such as oxygen or water, from entering the organic light emitting device but contains inevitable impurities from the chemical composition, such as by-products formed during curing and an unreacted initiator. Such residues remain unremoved from the device and enter the organic layer or metal layer, impeding the driving of the device or shortening lifetime of the device.

Many devices undergo degradation by the ingress of oxygen and water in air and chemical gases or liquids used during fabrication of the devices. Encapsulation is applied to protect devices from such degradation. Various types of encapsulated devices are known. For example, U.S. Pat. No. 6,573,652 describes encapsulated liquid crystal displays, light emitting diodes, light emitting polymers, electroluminescent devices, and phosphorescent devices. Further, U.S. Pat. No. 6,548,912 describes encapsulated microelectronic devices, including integrated circuits, charge coupled devices, light emitting diodes, light emitting polymers, organic light emitting devices, metal sensor pads, micro-disk lasers, electrochromic devices, photochromic devices, and solar cells. Particularly, WO 2007/025140 relating to an encapsulated device and a fabrication method thereof describes a method for encapsulating the device by forming a barrier stack including at least one barrier layer and at least one polymeric coupling layer adjacent to a substrate under high vacuum. This encapsulation method requires a process for forming a multilayer (5- to 7-layer) structure consisting of metal oxide layers as barrier layers and organic layers as polymeric coupling layers to block oxygen and water. The process is complicated and makes it difficult to apply the encapsulation method to large-area substrates and flexible substrates. Particularly, the application of the metal oxide layers requires a sputtering process using gas and an etching process. The additional processes increase the risk of damage to the polymeric coupling layers during processing, which is a cause of poor barrier properties.

DETAILED DESCRIPTION OF THE INVENTION

Problems to be Solved by the Invention

The present invention is intended to provide a novel organic electronic device with long lifetime that employs highly etch resistant encapsulation films to effectively block the ingress of external oxygen and water and can be protected from decomposition caused by chemicals used in conventional processes for forming encapsulation films, and a method for fabricating the organic electronic device.

Means for Solving the Problems

According to one aspect of the present invention, there is provided an organic electronic device including a substrate on which an organic photoelectric element is arranged, a first encapsulation film surrounding the organic photoelectric element and containing an inorganic or organic material, a second encapsulation film surrounding the first encapsulation film and containing a cured product of a photocurable material having one or more ethylenically unsaturated bonds, and a third encapsulation film surrounding the second encapsulation film and containing a photocured product of a photocurable spin-on-glass (SOG) material.

According to a further aspect of the present invention, there is provided a method for fabricating an organic electronic device, including: providing a substrate on which an organic photoelectric element is arranged; applying an inorganic or organic material so as to surround the organic photoelectric element and drying the inorganic or organic material to form a first encapsulation film; applying a photocurable composition so as to surround the first encapsulation film and curing the photocurable composition to form a second encapsulation film; and applying a spin-on-glass (SOG) composition so as to surround the second encapsulation film and curing the SOG composition to form a third encapsulation film.

Effects of the Invention

The organic electronic device of the present invention employs a plurality of encapsulation films and is not affected by external environmental factors, such as oxygen and water entering from the outside, to effectively prevent the driving and lifetime of the device from deterioration resulting from the external environmental factors. Particularly, according to the method of the present invention, the formation of encapsulation films enables the fabrication of the device over a large area and is performed in a simple manner. Therefore, the method of the present invention is expected to be economically efficient and environmentally friendly. According to the method of the present invention, encapsulation films can be formed by roll-to-roll and printing processes (e.g., inkjet and slit coating) on flexible substrates as well as existing substrates. Furthermore, the method of the present invention can be applied to the fabrication of various organic electronic devices, such as OLED displays, backlights (e.g., OLED and TFT-LCD backlights), flat panel light sources for lighting applications, flexible OLED flat panel displays, flexible OLED flat panel lighting systems, organic photovoltaics (OPVs), dye-sensitized solar cells (DSSCs), thin film solar cells, organic thin film transistors (OTFTs), and printed electronics materials.

BRIEF DESCRIPTION OF THE DRAWINGS

FIG. 1 is a cross-sectional view schematically illustrating the structure of an organic electronic device according to one embodiment of the present invention.

MODE FOR CARRYING OUT THE INVENTION

Embodiments of the present invention will now be described in detail with reference to the accompanying drawings. These embodiments are provided so that this disclosure will be thorough and complete, and will fully convey the scope of the invention to those skilled in the art. Accordingly, the present invention may be embodied in many different forms and should not be construed as limited to the exemplary embodiments set forth herein. In the drawings, the dimensions, such as widths, lengths and thicknesses, of elements may be exaggerated for clarity. The drawings are explained from an observer's point of view. It will be understood that when an element is referred to as being "on" another element, it can be directly on the other element, or one or more intervening elements may also be present therebetween.

One aspect of the present invention provides an organic electronic device including a plurality of encapsulation films.

FIG. 1 is a cross-sectional view schematically illustrating the structure of an organic electronic device according to one embodiment of the present invention. Referring to FIG. 1, the organic electronic device 100 includes a substrate 110 on which an organic photoelectric element 120 is arranged, a first encapsulation film 130, a second encapsulation film 140, and a third encapsulation film 150.

The substrate 110 used in the organic electronic device 100 of the present invention may be an inorganic substrate, such as a glass or silicon substrate, a metal substrate or a flexible substrate, such as a plastic substrate or a metal foil. Examples of preferred materials for the flexible substrate include polynorbornene, polyamide, polyethersulfone (PES), polyimide, polyether imide, polycarbonate, polyethylene terephthalate, polyester, polyethylene naphthalate (PEN), and polylatic acid.

The organic photoelectric element 120 arranged on the substrate 110 may include a transparent electrode, an organic layer, and a metal layer and functions to convert light energy into electrical energy or vice versa. The organic photoelectric element 120 may be a light receiving element (such as a photodiode or a solar cell) for converting optical signal changes into electrical signals. Alternatively, the organic photoelectric element 120 may be a light emitting element (such as an organic electroluminescent element) for outputting electrical signal changes as optical signals.

Therefore, the organic electronic device 100 of the present invention may be, for example, an OLED display, a backlight (e.g., an OLED or TFT-LCD backlight), a flat panel light source for lighting applications, a flexible OLED flat panel display, flexible OLED flat panel lighting system, an organic photovoltaic (OPV), a dye-sensitized solar cell (DSSC), a thin film solar cell, an organic thin film transistor (OTFT) or a printed electronics material.

The first encapsulation film 130 surrounds the organic photoelectric element 120 and contains an inorganic or organic material. The first encapsulation film 130 surrounding the organic photoelectric element 120 protects the organic photoelectric element 120 from being contaminated by external environmental factors, such as water or oxygen.

The first encapsulation film 130 may be introduced by wet processing. In this case, however, the use of an organic solvent or solution during wet processing may result in damage to the organic photoelectric element in the form of a thin film or the formation of defects in the organic photoelectric element, extremely shortening the lifetime of the organic photoelectric element. It is thus preferred to form the first encapsulation film 130 by dry processing. For example, the first encapsulation film 130 may be formed by deposition under a vacuum of $10^{-2}$ to $10^{-8}$ torr. Examples of suitable deposition processes include sputtering, atomic layer deposition (ALD), and thermal evaporation.

The inorganic material may be selected from metals, metal oxides, metal fluorides, metal nitrides, metal carbides, metal carbonitrides, metal oxynitrides, metal borides, metal oxyborides, metal silicides, silicon oxides, silicon nitrides, and combinations thereof. The inorganic material is preferably selected from AlOx, SiNx, and HfOx, which are easily formed into uniform thin films by sputtering or atomic layer deposition (ALD) and have excellent oxygen and water barrier properties.

The organic material may be a melamine compound. Specifically, the organic material may be selected from the group consisting of cardo compounds, melamine, ammeline, ammelide, and melam. Preferred is melamine that is easily formed into a uniform thin film by thermal evaporation and has excellent gas and water barrier properties.

The inorganic material has excellent gas and water barrier properties but undergoes a complex process and is not readily formed into a uniform thin film. In contrast, the organic material is simple to process and is very easily formed into a uniform thin film. Melamine is particularly advantageous due to its excellent oxygen and water barrier properties.

The first encapsulation film 130 has a thickness of 0.1 to 5 µm, preferably 0.2 to 1 µm. If the thickness of the first encapsulation film is smaller than the lower limit defined above, the ability of the first encapsulation film to protect the organic photoelectric element may be unsatisfactory. Meanwhile, if the thickness of the first encapsulation film exceeds the upper limit defined above, a considerable processing cost may be incurred and a low transmittance may be caused, leading to deterioration of the characteristics of the device.

The second encapsulation film 140 surrounds the first encapsulation film 130 and contains a cured product of a photocurable material having one or more ethylenically unsaturated bonds. The second encapsulation film 140 surrounding the first encapsulation film 130 prevents water from entering through defects in the first encapsulation film 130 while protecting the first encapsulation film 130.

The second encapsulation film 140 may be formed by dry or wet processing. For example, the dry processing may be performed by thermal evaporation and/or vapor deposition under high vacuum. The wet processing may be performed by applying a solution containing a photocurable material to the first encapsulation film 130 at ambient pressure under a nitrogen atmosphere. The application may be performed by any suitable process, such as spin coating, slit coating, spray coating, inkjet printing, gravure printing, comma coating or roll-to-roll coating. The applied photocurable material may be cured by UV irradiation to form the second encapsulation film 140.

The photocurable material may be a substituted or unsubstituted $C_6$-$C_{30}$ hydrocarbon compound having one or more ethylenically unsaturated bonds. The photocurable material may be used alone or in combination with one or more other photocurable materials.

The photocurable material is preferably a mixture of acrylic compounds suitable for vapor deposition. More preferably, the acrylic compounds are selected from mono (meth)acrylates, di(meth)acrylates, and tri(meth)acrylates. In this case, the photocurable material can be sufficiently cured and easily formed into a thin film.

Examples of suitable acrylic compounds include poly (meth)acrylate monomers, such as di(meth)acrylate compounds, tri(meth)acrylate compounds, and higher (meth) acrylate compounds, and oligomeric (meth)acrylate compounds.

Preferred di(meth)acrylate compounds include 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentyl glycol hydroxypivalate diacrylate, caprolactone modified neopentyl glycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, hydroxypivaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecane dimethanol diacrylate, triethylene glycol diacrylate, and tripropylene glycol diacrylate.

Preferred tri(meth)acrylate compounds include glycerol triacrylate, trimethylolpropane triacrylate, ethoxylated triacrylate (e.g., ethoxylated (3) trimethylolpropane triacrylate, ethoxylated (6) trimethylolpropane triacrylate, ethoxylated (9) trimethylolpropane triacrylate, and ethoxylated (20) trimethylolpropane triacrylate), pentaerythritol triacrylate, propoxylated triacrylate (e.g., propoxylated (3) glyceryl triacrylate, propoxylated (5.5) glyceryl triacrylate, propoxylated (3) trimethylolpropane triacrylate, and propoxylated (6) trimethylolpropane triacrylate), trimethylolpropane triacrylate, pentaerythritol triacrylate, and tris(2-hydroxyethyl) isocyanurate triacrylate.

Preferred higher (meth)acrylate compounds include ditrimethylolpropane tetraacrylate, dipentaerythritol pentaacrylate, ethoxylated (4) pentaerythritol tetraacrylate, pentaerythritol tetraacrylate, and caprolactone modified dipentaerythritol hexaacrylate.

Preferred oligomeric (meth)acrylate compounds include urethane acrylate, polyester acrylate, epoxy acrylate, polyacrylamide analogues thereof (e.g., N,N-dimethylacrylamide), and combinations thereof.

Particularly, the hydrocarbon compound is selected from the following structures 1:

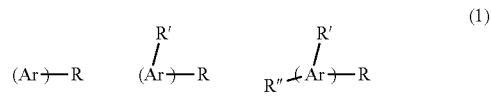

(1)

wherein each Ar is a substituted or unsubstituted $C_6$-$C_{20}$ aryl group or a substituted or unsubstituted $C_3$-$C_{20}$ heteroaryl group, R, R', and R" are identical to or different from each other and are each independently a substituted or unsubstituted $C_3$-$C_{20}$ alkyl group, a substituted or unsubstituted $C_3$-$C_{20}$ heteroalkyl group, with the proviso that each of R, R', and R" includes at least one ethylenically unsaturated bond in the chain.

The hydrocarbon compound is advantageous in improving the etch resistance of the encapsulation film.

The term "alkyl" used herein includes straight, branched, cyclic hydrocarbon radicals, and combinations thereof. The term may optionally include one or more double bonds, triple bonds or a combination thereof in the chain. That is, "alkyl" is intended to include alkenyl and alkynyl.

The term "heteroalkyl", by itself or in combination with another term, means, unless otherwise stated, a stable straight, branched, cyclic hydrocarbon radical or a combination thereof, consisting of one or more carbon atoms and one or more heteroatoms selected from the group consisting of O, N, P, Si, and S, and wherein the nitrogen, phosphorus, and sulfur atoms may optionally be oxidized and the nitrogen heteroatom may optionally be quaternized.

The terms "cycloalkyl" and "heterocycloalkyl", by themselves or in combination with other terms, represent, unless otherwise stated, cyclic versions of "alkyl" and "heteroalkyl", respectively.

The term "aryl" means, unless otherwise stated, a polyunsaturated, aromatic, hydrocarbon substituent which can be a single ring or multiple rings (from 1 to 3 rings) which are fused together or linked covalently. The term "heteroaryl" refers to aryl groups (or rings) that contain from one to four heteroatoms (in each separate ring in the case of multiple rings) selected from N, O, and S, wherein the nitrogen and sulfur atoms are optionally oxidized, and the nitrogen atom(s) are optionally quaternized. The heteroaryl group can be attached to the remainder of the molecule through a carbon or heteroatom.

The aryl includes a 4- to 7-membered, preferably 5- or 6-membered monocyclic or fused ring. The aryl is also intended to include a structure in which one or more aryl groups are linked via a chemical bond.

Specific examples of suitable aryl groups include, but are not limited to, phenyl, naphthyl, biphenyl, anthryl, indenyl, fluorenyl, phenanthryl, triphenylenyl, pyrenyl, perylenyl, chrysenyl, naphthacenyl, and fluoranthenyl.

The heteroaryl includes a 5- or 6-membered monocyclic heteroaryl and a polycyclic heteroaryl fused with one or more benzene rings and may also be partially saturated. The heteroaryl is also intended to include a structure in which one or more heteroaryl groups are linked via a chemical bond. The heteroaryl includes a divalent aryl group in which the heteroatoms in the ring are oxidized or quaternized to form an N-oxide or a quaternary salt.

Specific examples of suitable aryl groups include, but are not limited to, phenyl, naphthalenyl, anthracenyl, phenanthrenyl, pyrenyl, perylenyl, triphenylenyl, and fluorenyl.

Examples of suitable heteroaryl groups include, but are not limited to, pyridinyl, pyrimidinyl, benzoxazolyl, tetrahydrofuranyl, furanyl, thiophenyl, pyrrolidinyl, imidazolyl, pyrazolyl, thiazolyl, triazolyl, carbazolyl, benzofuranyl, quinolyl, isoquinolyl, triazinyl, indolyl, indazolyl, imidathiazolyl, isothiazolyl, oxazolyl, and isoxazolyl.

The term "substituted" in the expression of "substituted or unsubstituted" described herein means that one or more hydrogen atoms in the hydrocarbon are each independently replaced by the same or different substituents.

Suitable substituents include, but are not limited to, —F, —Cl, —Br, —CN, —NO$_2$—, OH, $C_1$-$C_{20}$ alkyl groups substituted or unsubstituted with —F, —Cl, —Br, —CN, —NO$_2$ or —OH, $C_1$-$C_{20}$ alkoxy groups substituted or unsubstituted with —F, —Cl, —Br, —CN, —NO$_2$ or —OH, $C_6$-$C_{30}$ aryl groups substituted or unsubstituted with $C_1$-$C_{20}$ alkyl, $C_1$-$C_{20}$ alkoxy, —F, —Cl, —Br, —CN, —NO$_2$ or —OH, $C_6$-$C_{30}$ heteroaryl groups substituted or unsubstituted with $C_1$-$C_{20}$ alkyl, $C_1$-$C_{20}$ alkoxy, —F, —Cl, —Br, —CN, —NO$_2$ or —OH, $C_5$-$C_{20}$ cycloalkyl groups substituted or unsubstituted with $C_1$-$C_{20}$ alkyl, $C_1$-$C_{20}$ alkoxy, —F, —Cl, —Br, —CN, —NO$_2$ or —OH, $C_5$-$C_{30}$ heterocycloalkyl groups substituted or unsubstituted with $C_1$-$C_{20}$ alkyl, $C_1$-$C_{20}$ alkoxy, —F, —Cl, —Br, —CN, —NO$_2$ or —OH, and groups represented by —N($G_1$)($G_2$) (where $G_1$ and $G_2$ may be each independently hydrogen, a $C_1$-$C_{10}$ alkyl group or a $C_6$-$C_{30}$ aryl group substituted or unsubstituted with $C_1$-$C_{10}$ alkyl).

For example, the photocurable material may be a compound including a maleimidyl or oxazolidonyl structure and photocurable (meth)acrylate groups in the molecule.

The photocurable material having a weight average molecular weight of 100 to 600 and a vapor pressure of at least $10^{-4}$ torr at 300° C. or less is particularly preferred for a dry process based on vapor deposition. Meanwhile, the photocurable material having a weight average molecular weight in the range of 300 to 2,000 is preferred for a wet process. Within this range, the thickness of the thin film, coating characteristics, and the uniformity of the thin film can be maintained constant. The second encapsulation film may have a thickness of 0.1 to 10 μm. The second encapsulation film is preferably 1 to 5 μm thick. If the thin film is thinner than 0.1 μm, photocuring proceeds rapidly but the characteristics of the encapsulation film deteriorate. Meanwhile, if the thin film is thicker than 10 μm, photocuring proceeds slowly and sufficient curing of the photocurable material is thus difficult to obtain, resulting in poor characteristics of the encapsulation film.

The third encapsulation film 150 surrounds the second encapsulation film 140 and contains a photocured product of a photocurable spin-on-glass (SOG) material. The SOG material has excellent film characteristics in terms of electrical insulation, transparency, and mechanical strength. The SOG material may be an organic silane compound. For example, the SOG material may be a polymeric material prepared from an acidolysis product of an organic silane and having photocurable (meth)acrylate groups introduced therein. The SOG polymeric material may be mixed with a photoactive material capable of inducing a photoreaction by UV irradiation to prepare a coating solution. The coating solution is applied to the substrate by spin coating and is cured by UV irradiation to form a SOG layer.

The SOG material may be, for example, a siloxane, a hydrogen silsesquioxane (HSQ), a methylsilsequioxane (MSQ), a perhydropolysilazane, a polysilazane or a divinylsiloxane bis-benzocyclobutane (DVS-BCB).

The third encapsulation film 150 may be formed by any suitable process, such as inkjet printing, slit coating, spin coating or spray coating, at ambient pressure under a nitrogen atmosphere. However, there is no restriction on the coating or printing process. The photocurable SOG material may have a weight average molecular weight of 2,000 to 100,000, which is suitable for the formation of the third encapsulation film 150. Preferably, the photocurable SOG material has a weight average molecular weight in the range of 5,000 to 50,000. Within this range, the thickness of the thin film can be controlled and the characteristics of the thin film can be maintained constant.

The third encapsulation film 150 may further include nanogetters. The nanogetters are mainly composed of a metal oxide and have nanometer-sized pores, ensuring high hygroscopicity. Accordingly, the use of the nanogetters in admixture with the SOG material is effective in blocking the ingress of external water, achieving the desired effects of the encapsulation film.

The nanogetters may be metal oxide particles having a size not larger than 100 nm. The metal oxide may be, for example, CaO, MgO, $SiO_2$, BaO, TiO, ZrO or CrO. Preferably, the nanogetters may be present in an amount of 1 to 30 parts by weight, based on 100 parts by weight of the photocurable SOG material. If the amount of the nanogetters is less than the lower limit defined above, the moisture and oxygen barrier properties of the encapsulation film may not be enhanced. Meanwhile, if the amount of the nanogetters exceeds the upper limit defined above, the dispersibility of the nanogetters in the SOG solution may be insufficient, making it difficult to uniformly form the encapsulation film, and the encapsulation film is likely to be defective, resulting in its poor characteristics.

The third encapsulation film 150 may be a monolayer composed of the photocurable SOG material and optionally the nanogetters. Alternatively, the third encapsulation film 150 may have a structure in which a layer composed of the SOG material and a layer composed of a mixture of the SOG material and the nanogetters are laminated with each other. The thickness of the third encapsulation film 150 is preferably in the range of 1 to 50 µm. If the third encapsulation film is thinner than 1 µm, photocuring proceeds rapidly but the characteristics of the encapsulation film deteriorate. Meanwhile, if the third encapsulation film is thicker than 50 µm, photocuring proceeds slowly and the thin film is apt to crack as curing proceeds appreciably, resulting in considerable deterioration of its characteristics. The most preferred thickness of the third encapsulation film 150 is in the range of 10 to 30 µm. Within this range, the best characteristics of the encapsulation film can be ensured.

The third encapsulation film 150 surrounds and protects the second encapsulation film 140 to achieve improved water and oxygen barrier properties. Particularly, the third encapsulation film including the SOG material and the nanogetters is protected from scratches due to its excellent mechanical properties. Accordingly, the third encapsulation film is free of defects, and as a result, its water and gas barrier properties can be effectively prevented from deteriorating. Above all, the third encapsulation film can be formed to a large thickness without cracks even during processing and can thus be applied to flexible devices.

As described above, the organic electronic device of the present invention employs encapsulation films with excellent barrier properties. Therefore, the organic electronic device of the present invention can be effectively protected from external water and oxygen and has good etch resistance to achieve its long-term operation.

A further aspect of the present invention provides a method for fabricating an organic electronic device including a plurality of encapsulation films. Specifically, the method includes: providing a substrate on which an organic photoelectric element is arranged; applying an inorganic or organic material so as to surround the organic photoelectric element and drying the inorganic or organic material to form a first encapsulation film; applying a photocurable composition so as to surround the first encapsulation film and curing the photocurable composition to form a second encapsulation film; and applying a spin-on-glass (SOG) composition so as to surround the second encapsulation film and curing the SOG composition to form a third encapsulation film.

The first encapsulation film may be formed by deposition under a vacuum of $10^{-2}$ to $10^{-8}$ torr.

The photocurable composition used to form the second encapsulation film includes a substituted or unsubstituted $C_6$-$C_{30}$ hydrocarbon compound having one or more ethylenically unsaturated bonds as a photopolymerizable monomer, a photoinitiator, and one or more additives.

The photocurable photopolymerizable monomer may be used alone or in combination with one or more other photopolymerizable monomers.

Suitable photoinitiators include organic peroxides, azo compounds, quinines, nitro compounds, acyl halides, hydrazones, mercapto compounds, pyrylium compounds, imidazoles, chlorotriazines, benzoin, benzoin alkyl ethers, diketones, and phenones. Commercially available photoinitiators include Daracur™ 1173, Daracur™ 4265, Irgacure™ 651, Irgacure™ 184, Irgacure™ 1800, Irgacure™ 369, Irgacure™ 1700, Irgacure™ 907, and Irgacure™ 819, all of which are available from Ciba Geigy, and UVI-6976 and UVI-6992, all of which are available from Aceto Corp. (Lake Success, N.Y., U.S.A.).

Other photoinitiators include phenyl-[p-(2-hydroxytetradecyloxy)phenyl]iodonium hexafluoroantimonate available from Gelest (Tullytown, Pa., U.S.A.) and phosphine oxide derivatives, such as 2,4,6-trimethylbenzoyl diphenyl phosphine oxide available from BASF (Charlotte, N.C., U.S.A.) under the trademark Lucirin™ TPO. The photoinitiator may be used at a concentration of about 0.1 to about 10 parts by weight or about 0.1 to 5 parts by weight, based on 100 parts by weight of the hydrocarbon compound.

The photoinitiator may be one that absorbs UV at a wavelength of 500 nm or less, particularly preferably, in the wavelength range of 380 nm to 410 nm. The photoinitiator may be used in combination with one or more other photoinitiators to maximize photocuring effects.

The additives may be selected from the group consisting of heat stabilizers, UV stabilizers, and antioxidants. Other various kinds of additives may also be used.

The SOG composition used to form the third encapsulation film may include a spin-on-glass (SOG) material, a photoactive material, and optionally nanogetters. The photocurable SOG material may have a weight average molecular weight of 2,000 to 100,000. The nanogetters may be metal oxide particles having a size not larger than 100 nm.

The photoactive material may be, for example, a photoinitiator, a photoacid generator or a photobase generator that absorbs UV at a wavelength of 450 nm or less. As the photoactive material, particularly preferred is a photoinitiator that has a maximum absorption wavelength in the range of 300 nm to 410 nm.

The present invention will be explained with reference to the following examples, including comparative examples. These examples are provided for convenience to assist the understanding of the invention and are not intended to limit the scope of the invention.

EXAMPLES

AlOx was deposited to a thickness of 0.5 µm on a PET film substrate, on which an organic light emitting element had been arranged, to form a first encapsulation film. Subsequently, a photocurable material was deposited on the first encapsulation film under a vacuum of $10^{-2}$-$10^{-4}$ torr at 150-200° C. The photocurable material was a mixture of 5-20 wt % of dodecanediol acrylate (DA) as a monofunctional material, 10-95 wt % of dodecandiol dimethacrylate (DMA) as a difunctional material, and 5-40 wt % of trimethylolpropane triacrylate (A-TMPT) or triallyl trimellitate (TATM) as a trifunctional material.

Lucirin™ TPO (BASF, Charlotte, N.C. U.S.A.) as a photoinitiator was used together with the photocurable material. The photoinitiator was used in an amount of 1-10 wt %, based on the total weight of the photocurable material. The deposition thickness of the organic layer containing the photocurable material was adjusted to 1-5 µm depending on the intended purpose. The deposited photocurable organic material was photocured by UV irradiation to form a second encapsulation film in the form of a thin film.

Next, a photocurable SOG layer was formed so as to surround the second encapsulation film by solution coating under ambient temperature and pressure conditions in a nitrogen atmosphere. The use of a material having a weight average molecular weight of 5,000-50,000 was found to be preferable for the formation of the photocurable SOG layer. The photocurable SOG layer containing nanometer-sized MgO particles as nanogetters was found to be most preferable. A more detailed explanation regarding the compositions and characteristics of the encapsulation films are shown in Tables 1 and 2, respectively. The use of the organic light emitting element is merely illustrative and the above procedure is applicable to the fabrication of all organic electronic devices employing various organic photoelectric elements.

(Characterization of the Thin Films)

The thin film characteristics of the encapsulation films formed in Examples 1-31 and Comparative Examples 1-2 were evaluated in terms of thin film uniformity, crack occurrence, water vapor transmission rate (WVTR), and oxygen transmission rate (OTR). The results are shown in Table 2.

(1) Thin Film Uniformity

AlOx was deposited on a glass substrate having a size of 10 cm×10 cm to form a first encapsulation film. Thereafter, second and third encapsulation films were sequentially formed on the first encapsulation film by deposition. After completion of the deposition, the thicknesses of the thin film structure at 20 selected points were measured. The thin film structure was judged to be "○" when the uniformity was ≥90%, "Δ" when the uniformity was ≥80%, and "×" when the uniformity was <80% (2) Crack Occurrence AlOx was deposited on a glass substrate having a size of 10 cm×10 cm to form a first encapsulation film. Thereafter, second and third encapsulation films were sequentially formed by deposition and cured on the first encapsulation film. After completion of the curing, the thin film structure was sampled at 5 points. The samples were observed under a field emission scanning electron microscope (FE-SEM). The sample was judged to be "×" when no cracks were observed and "○" when cracks were observed.

(3) Oxygen Transmission Rate

Oxygen transmission rate (OTR) was measured using an OTR testing system (Oxtran 2/20, MOCON, U.S.A.) based on Method B (differential pressure method) described in JIS K7126 (published in 2000). Each sample was cut into two test pieces. The measurement was performed once per test piece. The two measured values were averaged and defined as the oxygen transmission rate of the sample.

(4) Water Vapor Transmission Rate

Water vapor transmission rate (WVTR) was measured using a WVTR testing system (Permatran W3/31, MOCON, U.S.A.) at 40° C. and 90% RH based on Method B (Infrared sensor method) described in JIS K7129 (published in 2000). Each sample was cut into two test pieces. The measurement was performed once per test piece. The two measured values were averaged and defined as the water vapor transmission rate of the sample.

TABLE 1

| Example No. | First encapsulation film | Second encapsulation film | | | | Third encapsulation film | |
|---|---|---|---|---|---|---|---|
| | | Monofunctional material (wt %) | Difunctional material (wt %) | Trifunctional material (wt %) | Initiator (wt %) | SOG | SOG + MgO nanogetters |
| Example 1 | AlOx | — | DMA (90) | A-TMPT (10) | TPO (3) | ○ | — |
| Example 2 | AlOx | — | DMA (80) | A-TMPT (20) | TPO (3) | ○ | — |
| Example 3 | AlOx | — | DMA (70) | A-TMPT (30) | TPO (3) | ○ | — |
| Example 4 | AlOx | DA (5) | DMA (90) | A-TMPT (5) | TPO (3) | ○ | — |
| Example 5 | AlOx | DA (10) | DMA (80) | A-TMPT (10) | TPO (3) | ○ | — |
| Example 6 | AlOx | DA (10) | DMA (85) | A-TMPT (5) | TPO (3) | ○ | — |
| Example 7 | AlOx | DA (10) | DMA (80) | A-TMPT (10) | TPO (3) | ○ | — |
| Example 8 | AlOx | DA (10) | DMA (85) | A-TMPT (15) | TPO (3) | ○ | — |
| Example 9 | AlOx | DA (10) | DMA (70) | A-TMPT (20) | TPO (3) | ○ | — |
| Example 10 | AlOx | — | DMA (90) | A-TMPT (10) | TPO (3) | ○ | — |
| Example 11 | AlOx | — | DMA (95) | A-TMPT (5) | TPO (3) | ○ | — |
| Example 12 | AlOx | — | DMA (90) | A-TMPT (10) | TPO (3) | — | ○ |
| Example 13 | AlOx | — | DMA (80) | A-TMPT (20) | TPO (3) | — | ○ |
| Example 14 | AlOx | — | DMA (70) | A-TMPT (30) | TPO (3) | — | ○ |
| Example 15 | AlOx | DA (5) | DMA (90) | A-TMPT (5) | TPO (3) | — | ○ |
| Example 16 | AlOx | DA (10) | DMA (80) | A-TMPT (10) | TPO (3) | — | ○ |
| Example 17 | AlOx | DA (10) | DMA (85) | A-TMPT (5) | TPO (3) | — | ○ |
| Example 18 | AlOx | DA (10) | DMA (80) | A-TMPT (10) | TPO (3) | — | ○ |
| Example 19 | AlOx | DA (10) | DMA (85) | A-TMPT (15) | TPO (3) | — | ○ |
| Example 20 | AlOx | DA (10) | DMA (70) | A-TMPT (20) | TPO (3) | — | ○ |
| Example 21 | AlOx | — | DMA (90) | A-TMPT (10) | TPO (3) | — | ○ |
| Example 22 | AlOx | — | DMA (95) | A-TMPT (5) | TPO (3) | — | ○ |
| Example 23 | AlOx | — | DMA (70) | TATM (20) | TPO (3) | | |
| Example 24 | AlOx | — | DMA (90) | TATM (10) | TPO (3) | | |
| Example 25 | AlOx | — | DMA (95) | TATM (5) | TPO (3) | | |
| Example 26 | AlOx | DA (100) | — | — | TPO (3) | ○ | — |
| Example 27 | AlOx | — | DMA (100) | — | TPO (3) | ○ | — |
| Example 28 | AlOx | — | — | A-TMPT (100) | TPO (3) | ○ | — |
| Example 29 | AlOx | DA (100) | — | — | TPO (3) | — | ○ |
| Example 30 | AlOx | — | DMA (100) | — | TPO (3) | — | ○ |
| Example 31 | AlOx | — | — | A-TMPT (100) | TPO (3) | — | ○ |
| Comparative Example 1 | PET film | | | | | | |
| Comparative Example 2 | PET film/organic polymer protective layer | | | | | | |

TABLE 2

| Example No. | Uniformity | Crack occurrence | Oxygen transmission rate (cc/m$^2$ · day) | Water vapor transmission rate (g/m$^2$ · day) |
|---|---|---|---|---|
| Example 1 | ○ | × | $3.0 \times 10^{-2}$ | $5.2 \times 10^{-3}$ |
| Example 2 | ○ | × | $2.4 \times 10^{-2}$ | $4.8 \times 10^{-3}$ |
| Example 3 | ○ | × | $2.0 \times 10^{-2}$ | $5.5 \times 10^{-3}$ |
| Example 4 | ○ | × | $3.5 \times 10^{-2}$ | $4.2 \times 10^{-3}$ |
| Example 5 | ○ | × | $3.2 \times 10^{-2}$ | $6.3 \times 10^{-3}$ |
| Example 6 | ○ | × | $8.5 \times 10^{-3}$ | $5.9 \times 10^{-3}$ |
| Example 7 | ○ | × | $2.3 \times 10^{-2}$ | $7.3 \times 10^{-3}$ |

TABLE 2-continued

| Example No. | Uniformity | Crack occurrence | Oxygen transmission rate (cc/m² · day) | Water vapor transmission rate (g/m² · day) |
|---|---|---|---|---|
| Example 8 | ○ | x | $1.5 \times 10^{-2}$ | $6.9 \times 10^{-3}$ |
| Example 9 | ○ | x | $2.2 \times 10^{-2}$ | $8.3 \times 10^{-3}$ |
| Example 10 | ○ | x | $9.2 \times 10^{-3}$ | $4.5 \times 10^{-3}$ |
| Example 11 | ○ | x | $7.3 \times 10^{-3}$ | $3.8 \times 10^{-3}$ |
| Example 12 | ○ | x | $2.4 \times 10^{-3}$ | $0.9 \times 10^{-4}$ |
| Example 13 | ○ | x | $3.2 \times 10^{-3}$ | $1.3 \times 10^{-4}$ |
| Example 14 | ○ | x | $2.7 \times 10^{-3}$ | $2.3 \times 10^{-4}$ |
| Example 15 | ○ | x | $4.2 \times 10^{-3}$ | $2.8 \times 10^{-4}$ |
| Example 16 | ○ | x | $5.3 \times 10^{-3}$ | $4.6 \times 10^{-4}$ |
| Example 17 | ○ | x | $5.7 \times 10^{-3}$ | $5.1 \times 10^{-4}$ |
| Example 18 | ○ | x | $5.1 \times 10^{-3}$ | $5.5 \times 10^{-4}$ |
| Example 19 | ○ | x | $6.5 \times 10^{-3}$ | $7.3 \times 10^{-4}$ |
| Example 20 | ○ | x | $6.3 \times 10^{-3}$ | $7.0 \times 10^{-4}$ |
| Example 21 | ○ | x | $1.1 \times 10^{-3}$ | $1.6 \times 10^{-4}$ |
| Example 22 | ○ | x | $1.7 \times 10^{-3}$ | $3.1 \times 10^{-4}$ |
| Example 23 | ○ | x | $4.3 \times 10^{-3}$ | $5.4 \times 10^{-4}$ |
| Example 24 | ○ | x | $1.0 \times 10^{-3}$ | $1.1 \times 10^{-4}$ |
| Example 25 | ○ | x | $1.1 \times 10^{-3}$ | $2.5 \times 10^{-4}$ |
| Example 26 | ** | ** | 10.2 | 8.2 |
| Example 27 | ** | ** | 8.5 | 7.8 |
| Example 28 | x | ○ | 7 | 4.2 |
| Example 29 | ** | ** | 15 | 8.9 |
| Example 30 | ** | ** | 10 | 7.2 |
| Example 31 | x | ○ | 7 | 6.2 |
| Comparative Example 1* | — | — | 10 | 7 |
| Comparative Example 2* | Δ | ○ | 3.2 | 8.5 |

*Langowski, H. C., 39th Annual Technical Conference Proceeding, SVC, pp. 398-401 (1996)
** Impossible to form thin film due to insufficient curing As can be seen from the results in Tables 1 and 2, the encapsulation film structures of Examples 1-31, each of which was formed on the PET film, had higher water vapor transmission rates and oxygen transmission rates than the PET film of Comparative Example 1 and the organic polymer layer of Comparative Example 2, which was formed on the PET film. Particularly, the encapsulation film structures of Examples 1-25, in which each second encapsulation film was formed using two or more photocurable materials on the AlOx layer, showed higher water vapor transmission rates and oxygen transmission rates than the encapsulation film structures of Examples 26-31, in which each second encapsulation film was formed using only one photocurable material on the AlOx layer.

These results clearly demonstrate that the trilayer structures of the encapsulation film structures of Examples 1-25 are responsible for their excellent oxygen and water barrier properties.

The invention claimed is:

1. An organic electronic device comprising a substrate on which an organic photoelectric element is arranged, a first encapsulation film surrounding the organic photoelectric element and comprising an inorganic or organic material, a second encapsulation film surrounding the first encapsulation film and comprising a photocurable material comprising one or more ethylenically unsaturated bonds, and a third encapsulation film surrounding the second encapsulation film and comprising a photocured product of a photocurable spin-on-glass (SOG) material, wherein the photocurable material comprising ethylenically unsaturated bonds is a substituted or unsubstituted $C_6$-$C_{30}$ hydrocarbon compound comprising one or more ethylenically unsaturated bonds.

2. The organic electronic device according to claim 1, wherein the inorganic material is selected from the group consisting of metals, metal oxides, metal fluorides, metal nitrides, metal carbides, metal carbonitrides, metal oxynitrides, metal borides, metal oxyborides, metal silicides, silicon oxides, silicon nitrides, and combinations thereof.

3. The organic electronic device according to claim 1, wherein the organic material is selected from the group consisting of cardo compounds, melamine, ammeline, ammelide, and melam.

4. The organic electronic device according to claim 1, wherein the photocurable material comprising ethylenically unsaturated bonds is a mixture of acrylic compounds.

5. The organic electronic device according to claim 4, wherein the acrylic compounds are selected from the group consisting of mono(meth)acrylates, di(meth)acrylates, and tri(meth)acrylates.

6. The organic electronic device according to claim 1, wherein the hydrocarbon compound is selected from the following structures 1:

(1)

wherein each Ar is a substituted or unsubstituted $C_6$-$C_{20}$ aryl group or a substituted or unsubstituted $C_3$-$C_{20}$ heteroaryl group, R, R', and R" are identical to or different from each other and are each independently a substituted or unsubstituted $C_3$-$C_{20}$ alkyl group, a substituted or unsubstituted $C_3$-$C_{20}$ heteroalkyl group, with the proviso that each of R, R', and R" comprises at least one ethylenically unsaturated bond in the chain.

7. The organic electronic device according to claim 1, wherein the photocurable material comprises a maleimidyl or oxazolidonyl structure and photocurable (meth)acrylate groups in the molecule.

8. The organic electronic device according to claim 1, wherein the third encapsulation film further comprises nanogetters.

9. The organic electronic device according to claim 8, wherein the nanogetters are metal oxide particles having a size not larger than 100 nm.

10. The organic electronic device according to claim 8, wherein the nanogetters are present in an amount of 1 to 30 parts by weight, based on 100 parts by weight of the photocurable SOG material.

11. The organic electronic device according to claim 1, wherein the first encapsulation film has a thickness of 0.1 to 5 μm, the second encapsulation film has a thickness of 0.1 to 10 μm, and the third encapsulation film has a thickness of 1 to 50 μm.

* * * * *